United States Patent
Whitney et al.

(10) Patent No.: US 10,886,732 B2
(45) Date of Patent: *Jan. 5, 2021

(54) REVERSE DIRECTION HIGH-ELECTRON-MOBILITY TRANSISTOR CIRCUIT

(71) Applicants: David L. Whitney, Saratoga, CA (US); Manuel M. Del Arroz, Diablo, CA (US)

(72) Inventors: David L. Whitney, Saratoga, CA (US); Manuel M. Del Arroz, Diablo, CA (US)

( * ) Notice: Subject to any disclaimer, the term of this patent is extended or adjusted under 35 U.S.C. 154(b) by 159 days.

This patent is subject to a terminal disclaimer.

(21) Appl. No.: 16/246,397

(22) Filed: Jan. 11, 2019

(65) Prior Publication Data

US 2020/0126970 A1 Apr. 23, 2020

Related U.S. Application Data

(60) Provisional application No. 62/749,017, filed on Oct. 22, 2018.

(51) Int. Cl.
| | | |
|---|---|---|
| *H02H 9/00* | (2006.01) | |
| *H02H 9/04* | (2006.01) | |
| *H01L 27/02* | (2006.01) | |
| *H03K 19/094* | (2006.01) | |
| *H03K 19/20* | (2006.01) | |
| *H01L 27/06* | (2006.01) | |
| *H01L 49/02* | (2006.01) | |
| *H01L 29/20* | (2006.01) | |
| *H01L 29/778* | (2006.01) | |
| *H01L 29/205* | (2006.01) | |

(52) U.S. Cl.
CPC ......... *H02H 9/046* (2013.01); *H01L 27/0248* (2013.01); *H01L 27/0285* (2013.01); *H01L 27/0605* (2013.01); *H01L 28/20* (2013.01); *H01L 29/20* (2013.01); *H03K 19/094* (2013.01); *H03K 19/20* (2013.01); *H01L 29/2003* (2013.01); *H01L 29/205* (2013.01); *H01L 29/7787* (2013.01)

(58) Field of Classification Search
None
See application file for complete search history.

(56) References Cited

U.S. PATENT DOCUMENTS

| | | | | |
|---|---|---|---|---|
| 4,931,669 | A * | 6/1990 | Higashisaka .... | H03K 19/01721 326/117 |
| 6,201,416 | B1 * | 3/2001 | Numata ............ | H03K 19/0013 326/107 |
| 9,083,343 | B1 * | 7/2015 | Li ........................ | H03K 17/567 |
| 2017/0092640 | A1 * | 3/2017 | Aoki ....................... | H01L 28/20 |

* cited by examiner

*Primary Examiner* — Stephen W Jackson
(74) *Attorney, Agent, or Firm* — Douglas L. Weller

(57) ABSTRACT

A circuit includes an output and a reverse direction high-electron-mobility transistor. The reverse direction high-electron-mobility transistor includes a drain connected to the output. The reverse direction high-electron-mobility transistor also includes a source and a gate. A transistor includes a source, a gate connected to a control pin and a drain connected to the gate of the reverse direction high-electron-mobility transistor.

20 Claims, 7 Drawing Sheets

REVERSE DIRECTION HIGH-ELECTRON-MOBILITY TRANSISTOR CIRCUIT

BACKGROUND

A metal-oxide-semiconductor field-effect transistor (MOSFET) uses an insulated gate to control current flow between a source and a drain of the MOSFET. Current Voltage characteristics of a conventional MOSFET are shown in FIG. 1. In FIG. 1, the horizontal axis represents voltage from the drain to the source (Vds). The vertical axis represents current values flow from the drain to the source (Ids). As long as the MOSFET is forward biased (Vds is positive), the gate-to-source voltage (Vgs)—sometimes called gate voltage Vg—controls current flow (Ids) through the MOSFET. The threshold voltage (Vth) is the minimum value of Vgs that is needed to create a conducting path between the source and the drain. As illustrated in FIG. 1, increasing the gate voltage above the threshold voltage results in increased conductivity.

When the MOSFET is negative biased (Vds is negative), the gate-to-source voltage (Vg) has less impact on current flow through the MOSFET. This is the result of a body diode intrinsic within FETs which allows current flow from source to drain regardless of the gate voltage. For example, in an n-channel MOSFET, the source and the drain are n+ regions and the body is a p region. The p-n junction formed at the intersection of the p body and the n+ regions act as a diode between the body and the source of the MOSFET and between the body and the drain of the MOSFET. Because in a MOSFET the source is typically shorted to the body, the body diode between the body and the source is irrelevant. However, the body diode to the drain allows a current path from the body to the drain when the MOSFET is negative biased (Vds is negative).

DETAILED DESCRIPTION

A high-electron-mobility transistor (HEMT) also known as a heterostructure FET (HFET) is a field-effect transistor incorporating a junction between two materials with different band gaps at the channel instead of a doped region. In a Gallium Arsenide (GaAs) HEMT, a depleted Aluminum Gallium Arsenide (AlGaAs) layer is placed over a non-doped narrow-bandgap channel layer of GaAs. The electrons generated in the thin n-type AlGaAs layer drop into the GaAs layer to form a depleted AlGaAs layer. The heterojunction created by different band-gap materials forms a quantum well in the conduction band on the GaAs side where the electrons can move quickly without colliding with any impurities. This creates a very thin layer of highly mobile conducting electrons with very high concentration, giving the channel very low resistivity. Other materials can be used to form a HEMT such as in a Gallium Nitride HEMT. GaN-based HEMTs have a similar layered structure where no intentional doping is required. In AlGaN/GaN HEMTs, electrons form a high carrier concentration at the interface, which leads to a two-dimensional electron gas (2DEG) channel due to the spontaneous polarization found in wurtzite-structured GaN. The 2DEG is a function of AlGaN thickness and the bound positive charge at the interface. AlGaN/GaN HEMTs providing high power density and breakdown voltage can be achieved. The polarization effect between the GaN channel layer and AlGaN barrier layer causes a sheet of uncompensated charge in the order of 0.01-0.03 Coulombs per meter (C/m) to form. If the 2DEG is continuous between source and drain the transistor will be normally "on" or depletion HEMT (dHEMT) turning "off" with a negative gate bias. With the addition of Mg doping or other techniques to compensate the built in charge under the gate, the 2DEG is not continuous at zero gate bias. This will achieve a normally off or enhancement mode behavior characteristic of an enhancement HEMT (eHEMT).

Additional eHEMT devices of interest are Indium Phosphate (InP) based HEMTs due to their high electron mobility, high electron saturation velocity, and high electron concentration. These devices are made of an InGaAs/InAlAs composite cap layer, an undoped InAlAs Schottky barrier and an InGaAs/InAs composite channel for superior electron transport properties.

Figure 1:
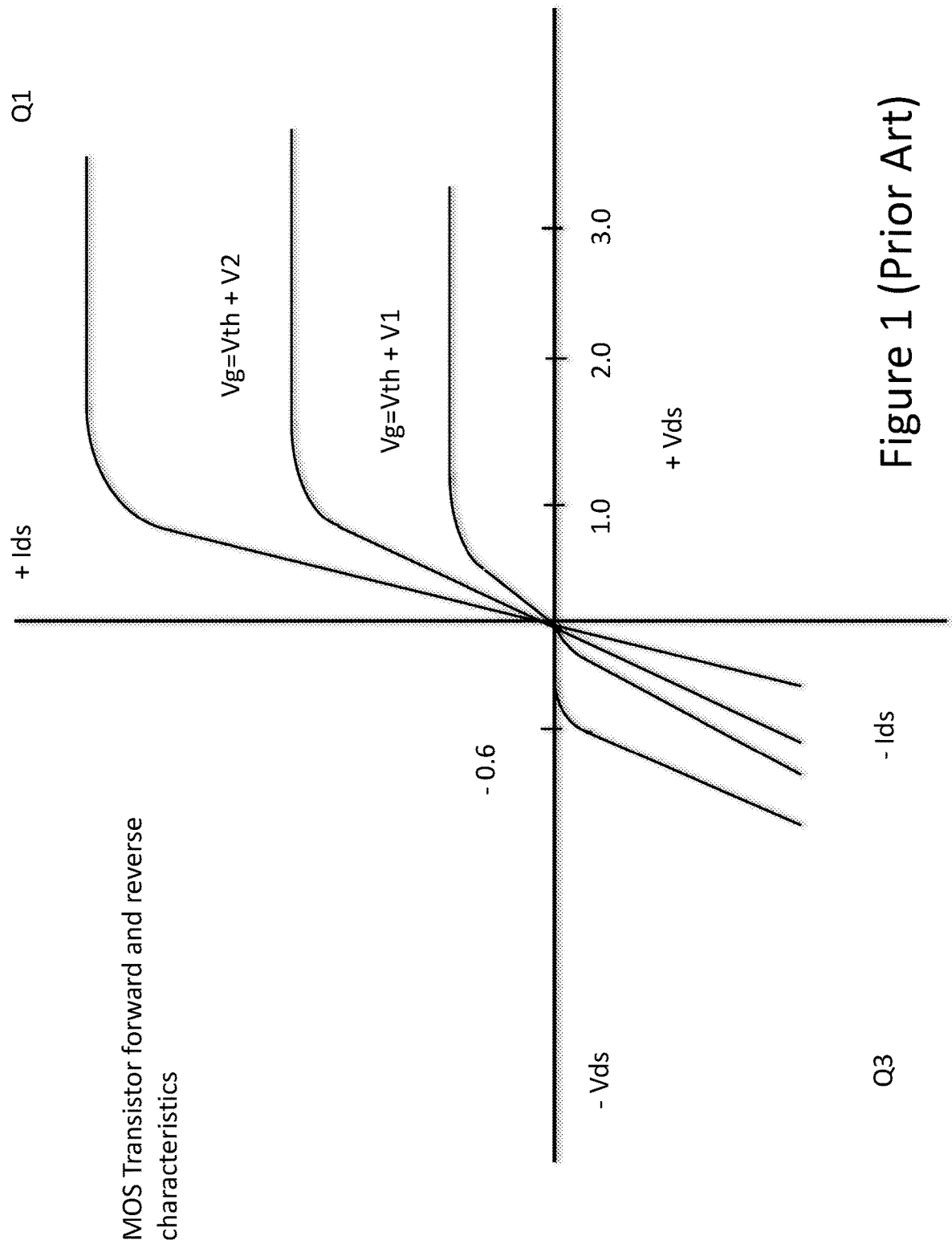
FIG. 1 shows current characteristics of a typical metal-oxide-semiconductor field-effect transistor (MOSFET) in accordance with the prior art.
Figure 2:
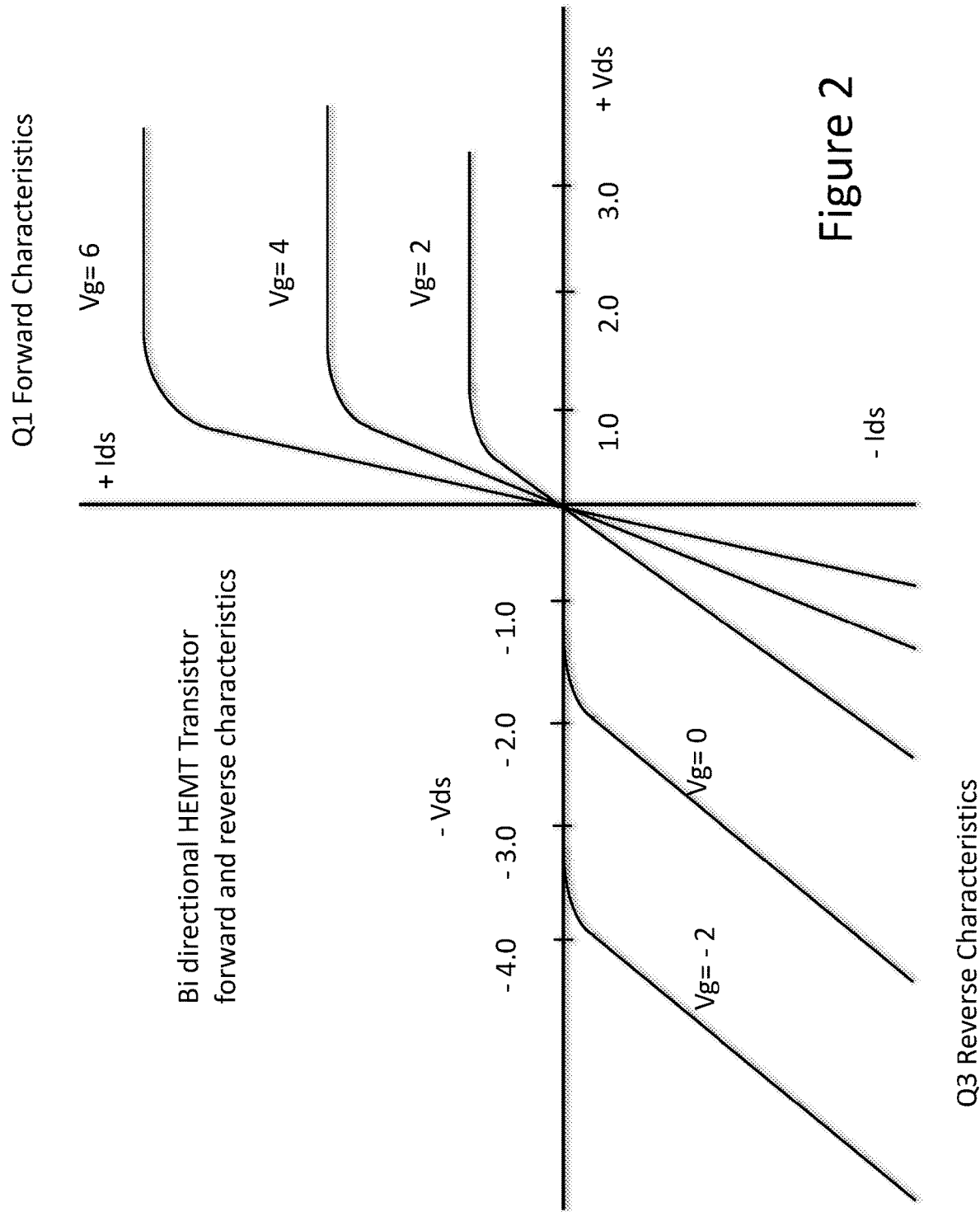
FIG. 2 shows current characteristics of a high-electron-mobility transistor (HEMT).

Since there is no p-n junction within an HEMT, there is no p-n body diode formed. This results in significantly different voltage characteristics between a HEMT and a MOSFET. For example, FIG. 2 shows current voltage characteristics of a HEMT. In FIG. 2, the horizontal axis represents voltage from the drain to the source (Vds). The vertical axis represents current values flow from the drain to the source (Ids). HEMT transistor current-voltage characteristics in the forward direction look similar to PN junction technologies like MOSFETs. That is, as long as the HEMT is forward biased (Vds is positive), the gate-to-source voltage (Vgs) controls current flow (Ids) through the HEMT.

The reverse conduction characteristics of a reverse direction HEMT (RDHEMT) are different than the reverse conduction characteristics of MOSFETS because in HEMTs there is no p-n body diode formed. In addition to the ability to block reverse voltages above the typical 0.6 volts of forward biased silicon PN junctions, some HEMT transistors turn on in the reverse direction with a negative voltage on the drain relative to the source (−Vds) primarily due to charge injection into the enhancement mode channel. This category of HEMT transistors have reverse conduction characteristics that differ from their forward conduction characteristics in both cause and form.

For example, Gallium nitride HEMTs are an example of HEMT transistors that have a reverse conduction mode and have attracted attention due to their high-power and high frequency performance. In the reverse direction, such an RDHEMT device starts to conduct when the absolute value of the negative drain voltage with respect to the source voltage |−Vds| is greater than the gate threshold voltage. The RDHEMT then exhibits a channel resistance and conducts current. If a negative gate voltage is applied with respect to the source voltage, the negative drain to source voltage must be increased for the RDHEMT to conduct current.

Figure 3:
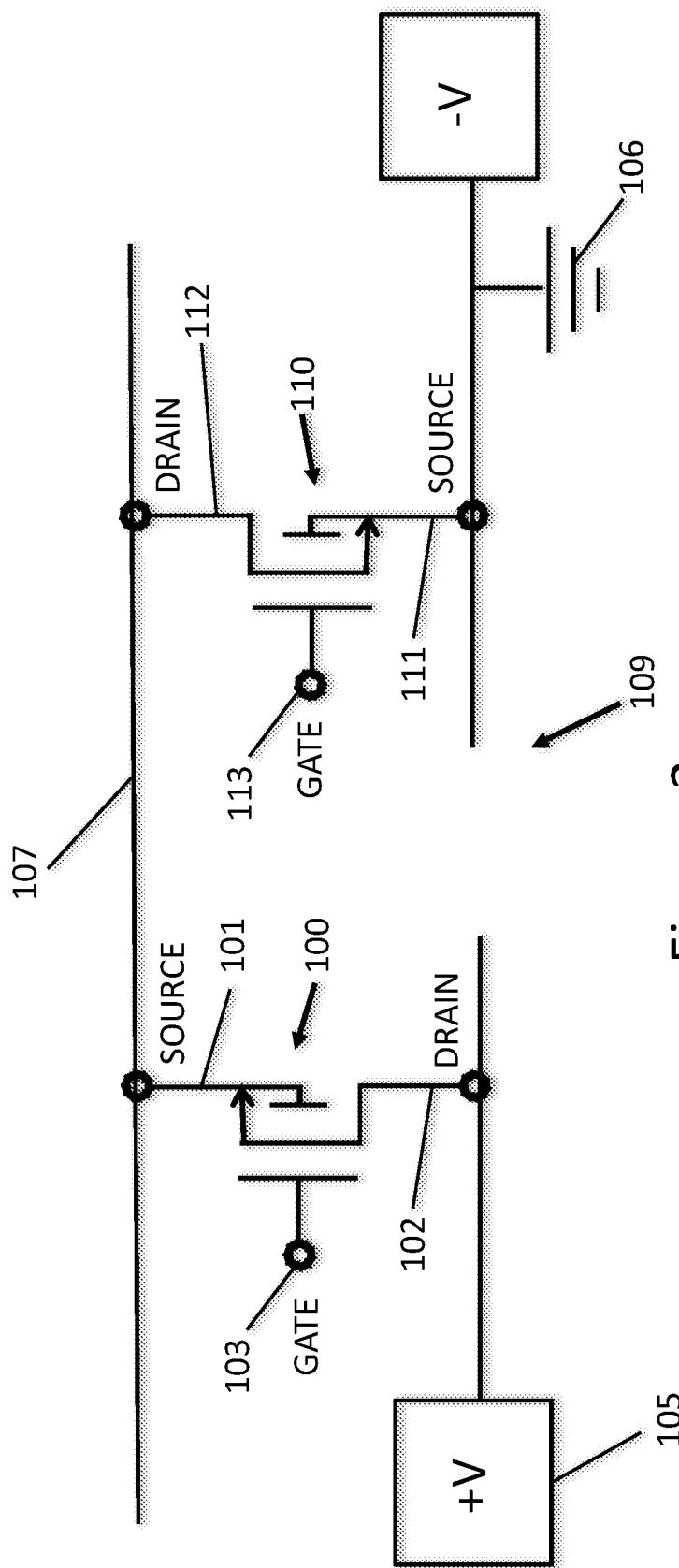
FIG. 3 is a simplified circuit diagram of a voltage clamping circuit.

FIG. 3 is a simplified circuit diagram of a voltage clamping circuit 109 used to clamp voltage excursions by using RDHEMT operation in the reverse direction.

An RDHEMT 100 has a source 101, a drain 102 and a gate 103. An RDHEMT 110 has a source 111, a drain 112 and a gate 113. Source 111 and gate 113 of RDHEMT 110 are connected to a reference voltage 106 (−V). Drain 102 of RDHEMT 100 is connected to a reference voltage 105 (+V). Source 101 and gate 103 of RDHEMT 100 and drain 112 of RDHEMT 110 are all connected to a line 107 that is voltage clamped.

Because source 101 and gate 103 of RDHEMT 100 are connected to line 107, line 107 is voltage clamped from being significantly more positive than reference voltage reference voltage +V. When the voltage on line 107 is increased to be much greater than reference voltage +V, the drain to source voltage or Vds of RDHEMT 100 will decrease and go negative. As the voltage on line 107 continues to increase, the magnitude of the negative drain to source voltage of RDHEMT 100 will continue to increase until RDHEMT 100 begins to conduct current in the reverse direction from line 107 through to reference voltage 105 (+V), resulting in a voltage clamping effect on line 107.

The operating characteristics of RDHEMT 100 are illustrated in FIG. 2 as seen for the case where Vgs=0. When Vgs=0 and Vds is greater than −1.6 volts, there is no current flow through RDHEMT 100. When Vgs=0 and Vds is less than −1.6 volts, there is a reverse current flow through RDHEMT 100. This current flow at the voltage threshold of −1.6 volts is what allows RDHEMT 100 to clamp the voltage on line 107 beginning where the voltage on line 107 is 1.6 volts more than V+.

Because drain 112 of RDHEMT 110 is connected to line 107, line 107 is voltage clamped from being significantly more negative than reference voltage −V from reference voltage 106. When the voltage on line 107 is decreased to be much less than reference voltage −V, the drain to source voltage or Vds of RDHEMT 110 will decrease and go negative. As the voltage on line 107 continues to decrease, the magnitude of the negative drain to source voltage of RDHEMT 110 will continue to increase until RDHEMT 110 begins to conduct current in the reverse direction from line 107 to reference voltage 106, resulting in a voltage clamping effect on line 107.

The operating characteristics of RDHEMT 110 are also illustrated in FIG. 2 for the case where Vgs=0. When Vgs=0 and Vds is greater than −1.6 volts, there is no current flow through RDHEMT 110. When Vgs=0 and Vds is less than −1.6 volts, there is a reverse current flow through RDHEMT 110. This current flow at the voltage threshold of −1.6 volts is what allows RDHEMT 110 to clamp the voltage on line 107 beginning where the voltage on line 107 is 1.6 volts less than reference voltage −V. For RDHEMT 110, therefore, the voltage threshold of −1.6 volts is referred to herein as the reverse conduction onset voltage, or as the clamping voltage. The voltage at gate 103 and the voltage at gate 113 can be varied to modify the clamping voltage for RDHEMT 110. In general, the clamping voltage will be at the reverse conduction onset voltage.

Figure 4:
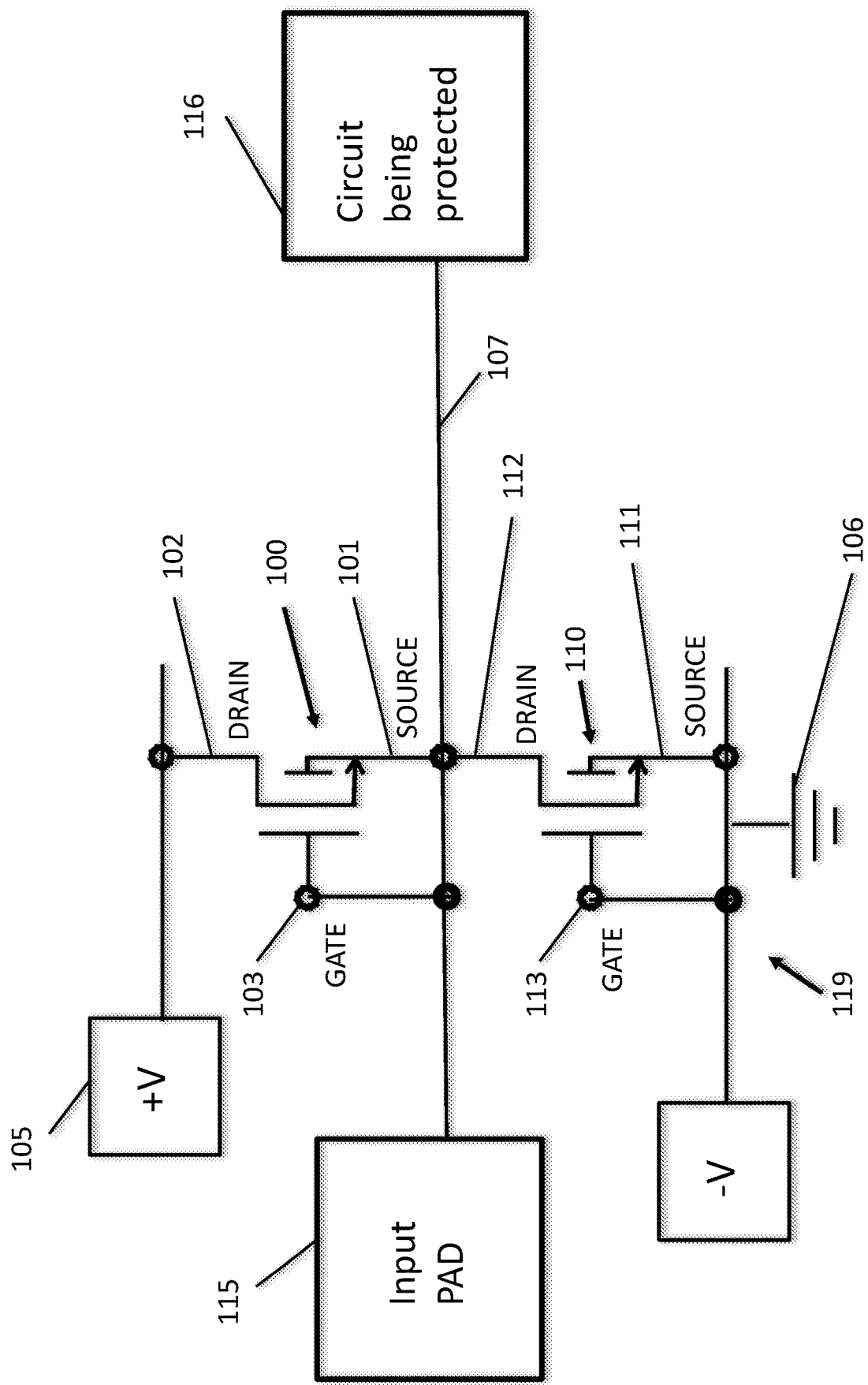
FIG. 4 is a simplified circuit diagram of a voltage clamping circuit providing electrostatic discharge protection for an input pad of an integrated circuit.

FIG. 4 shows voltage clamping circuit 119 used for electrostatic discharge (ESD) protection on an input pad 115 of an integrated circuit 116. When voltage on input pad 115 experiences an ESD or over voltage event, the voltage on input pad 115 can go positive or negative relative to the Gnd (−V) or reference voltage +V. Voltage clamping circuit 119 assures that the voltage does not go too far above reference voltage +V or too far below GND. As discussed above, beginning where the voltage on input pad 115 (and thus line 107) is 1.6 volts more than V+, there is a reverse current flow through RDHEMT 100. This current flow at the reverse conduction onset voltage of −1.6 volts is what allows RDHEMT 100 to clamp the voltage on input pad 115 beginning where the voltage on input pad 115 is 1.6 volts more than V+. Likewise, beginning where the voltage on input pad 115 is 1.6 volts less than V1 (Gnd), there is a reverse current flow through RDHEMT 110. This current flow at the reverse conduction onset voltage of −1.6 volts is what allows RDHEMT 110 to clamp the voltage on input pad 115 beginning where the voltage on input pad 115 is 1.6 volts less than V−.

Figure 5:
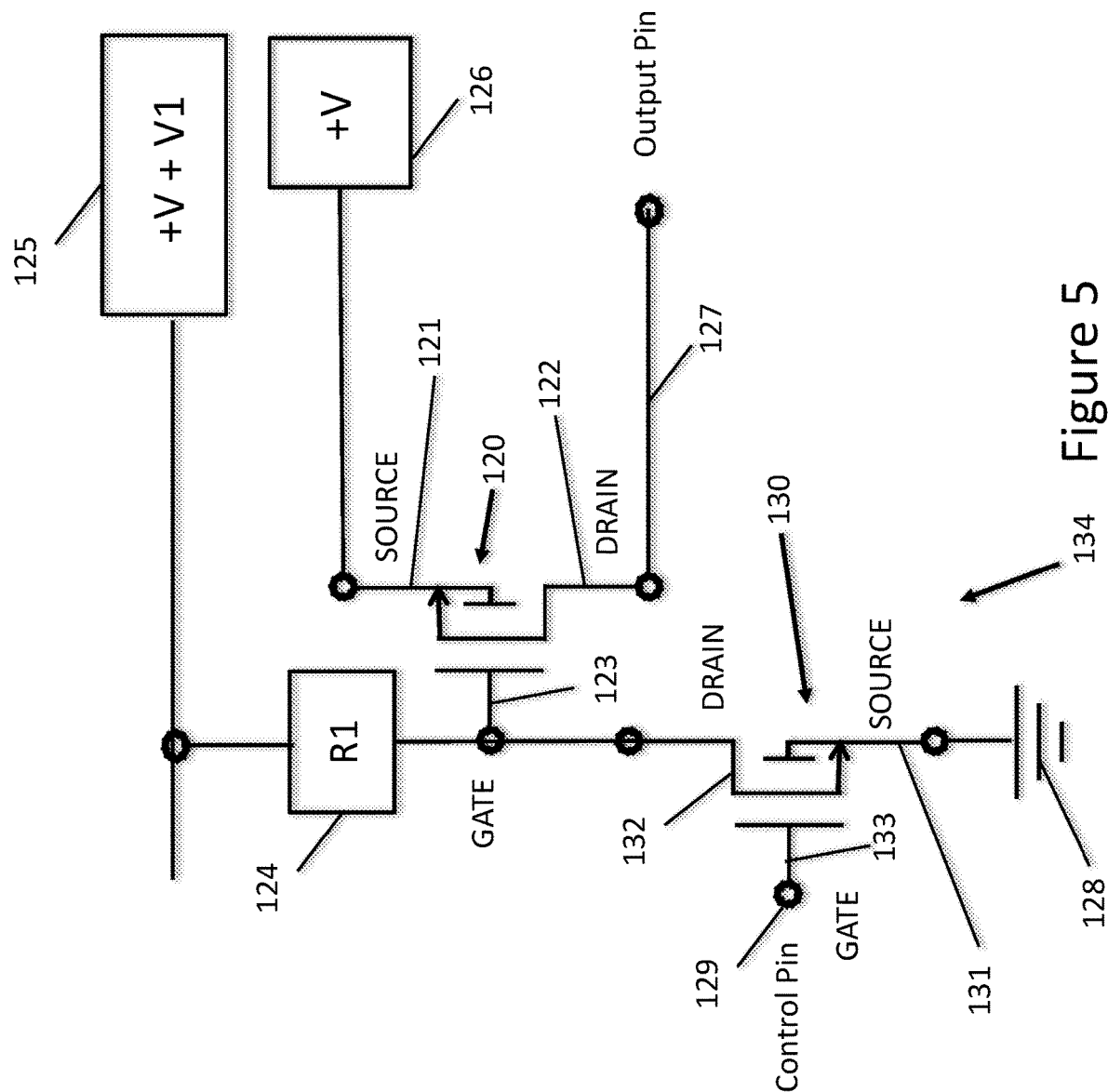
FIG. 5 is a simplified circuit diagram of a high side current source element circuit that provides voltage and current to an output pin of an integrated circuit.

FIG. 5 shows a high side current source element circuit 134 that provides voltage and current to an output pin 127 of an integrated circuit. A current limiting component 124 is, for example, a resistor or depletion mode transistor.

An RDHEMT 120 has a source 121, a drain 122 and a gate 123. A transistor 130 has a source 131, a drain 132 and a gate 133. Source 121 of RDHEMT 120 is connected to a reference voltage 126 (+V). Drain 122 of RDHEMT 120 is connected to output pin 127. Gate 123 of RDHEMT 120 is connected to current limiting component 124.

Source 131 of transistor 130 is connected to a reference voltage 128 (GND). Drain 132 of transistor 130 (+V) is connected to gate 123 of RDHEMT 120. Gate 133 of transistor 130 is connected to current pin input 129 controlled by the integrated circuit.

Current limiting component 124 is connected to a voltage 125, which is more positive than reference voltage 126 (+V) by a value of V1, so that voltage 125 has a value of +V+V1. In general the voltage V1 should be greater than or equal to the reverse conduction onset voltage. When the voltage on gate 123 of RDHEMT 120 is equal to or greater than the reverse conduction onset voltage for RDHEMT 120, RDHEMT 120 will source voltage and current. When voltage V1 is equal to the forward conduction threshold voltage, the output pin 127 will be pulled up to voltage reference voltage +V and the drain to source voltage (Vds) of transistor 140 will be near zero.

The voltage on drain 122 of RDHEMT 120, and thus voltage on output pin 127, is less than or equal to source voltage reference voltage +V which assures RDHEMT 120 is operating in a reverse conduction mode.

RDHEMT 120 will be turned off (i.e., Ids=0) when the gate to source voltage (Vgs) for RDHEMT 120 is sufficiently negative with respect to the drain to source voltage (Vds) for RDHEMT 120, as illustrated in the voltage characteristics for a RDHEMT as shown in FIG. 2.

Transistor 130 is, for example, a HEMT or a MOSFET operating in forward conduction mode. When control pin 129 at gate 133 of transistor 130 is at a voltage level sufficiently above the threshold voltage of transistor 130, transistor 130 will be ON and will pull the voltage on gate 123 of RDHEMT 120 near GND so that RDHEMT 120 will be OFF and output pin 127 will be at a voltage value indicating high impedance or an OPEN circuit. When control pin 129 is at a low voltage value below the threshold voltage of transistor 130, then transistor 130 will be OFF, allowing current limiting component 124 to pull gate 123 of RDHEMT 120 to the voltage value+V+V1 of reference voltage 125.

A significant advantage using a RDHEMT transistor in reverse mode is realized by RDHEMT 120 in FIG. 5 as it does not have saturation characteristic at low gate voltage similar to the forward conduction mode. This is caused by negative charge injected into the channel by the negatively charged Drain electrode. Conduction of the RDHEMT transistor is controlled by both the Vgs voltage and the −Vds voltage. This effect can be seen in FIG. 2.

Figure 6:
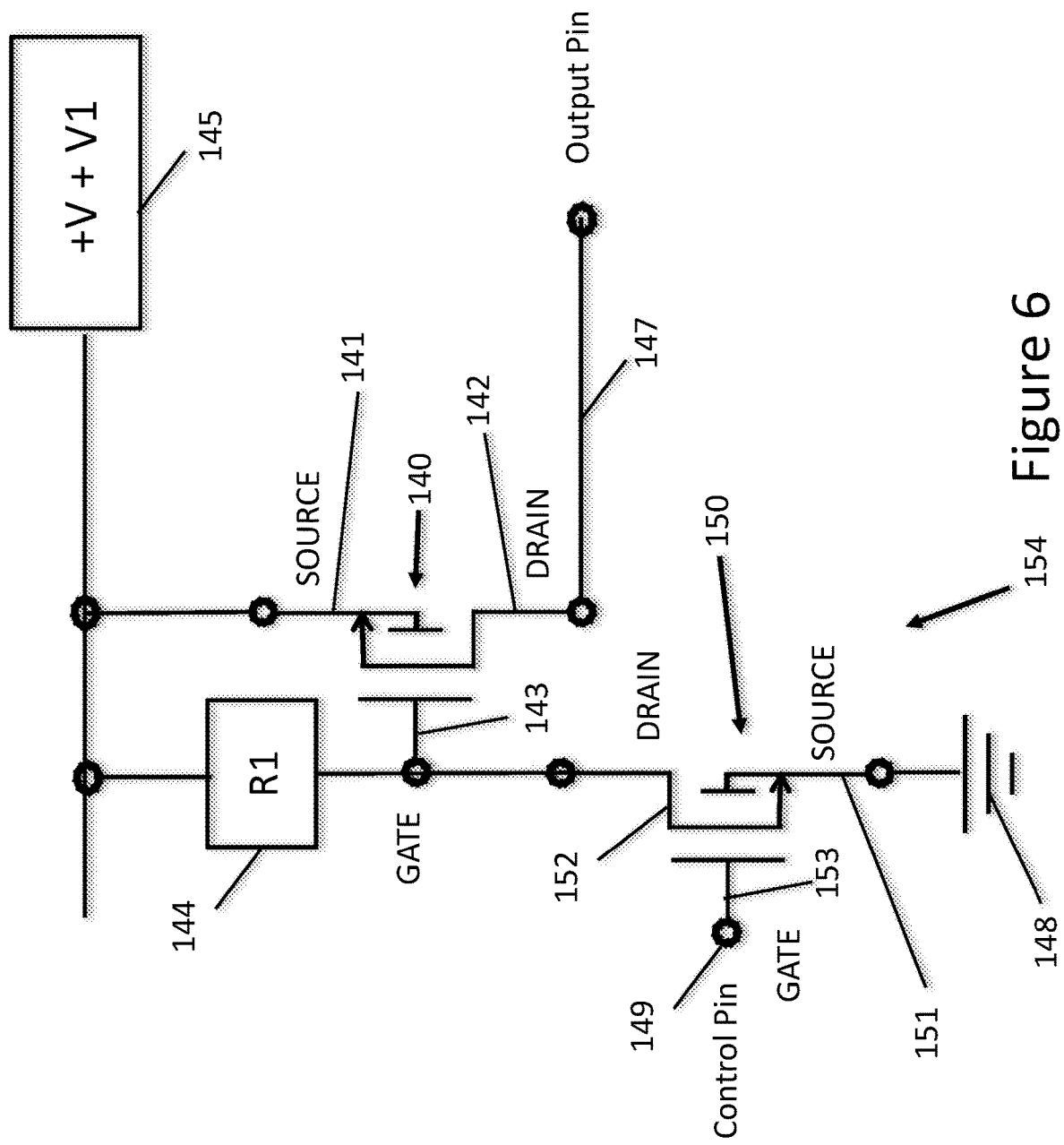
FIG. 6 is a simplified circuit diagram of another high side current source element circuit that provides voltage and current to an output pin of an integrated circuit.

FIG. 6 shows a high side current source element circuit 154 that provides voltage and current to an output pin 147 of an integrated circuit. A current limiting component 144 is, for example, a resistor or depletion mode transistor.

An RDHEMT 140 has a source 141, a drain 142 and a gate 143. A transistor 150 has a source 151, a drain 152 and a gate 153. Source 141 of RDHEMT 140 is connected to a positive voltage supply reference voltage 145 (+V+V1). Drain 142 of RDHEMT 140 is connected to output pin 147. Gate 143 of RDHEMT 140 is connected to current limiting component 144.

Source 151 of transistor 150 is connected to a reference voltage 148 (GND). Drain 152 of transistor 150 (+V) is connected to gate 143 of RDHEMT 140. Gate 153 of transistor 150 is connected to current pin input 149 controlled by the integrated circuit.

When the voltage on the gate of RDHEMT 140 is allowed to be pulled up to voltage supply reference voltage 145 (+V+V1), RDHEMT 140, will source voltage and current such that the voltage at output pin 147 will be pulled up to voltage (+V+V1)−Vrco, where Vrco is the reverse conduction onset voltage of RDHEMT 140. The voltage on drain 142 of RDHEMT 140, at output pin 147, will be less than or equal to voltage supply reference voltage 145 (+V+V1), which assures RDHEMT 140 is operating in the reverse conduction mode.

RDHEMT 140 will be OFF if the gate to source voltage (Vgs) of RDHEMT 140 is sufficiently negative with respect to the drain to source voltage (Vds) of RDHEMT 140 as illustrated in the voltage characteristics shown in FIG. 2.

For example, transistor 150 is a HEMT or MOS transistor operated in forward conduction mode. When voltage on control pin 149, at gate 153 of transistor 150, is at a voltage value sufficiently above the threshold voltage of transistor 150, transistor 150 will be ON and transistor 150 will pull the voltage on gate 143 of RDHEMT 140 near GND 148 so that RDHEMT 140 will be OFF and output pin 147 will be at a value indicating high impedance or OPEN circuit. When the control pin 149 is at a low voltage below the threshold voltage of transistor 150, then transistor 150 will be OFF allowing current limiting component 144 to pull gate 143 of RDHEMT 140 to voltage supply reference voltage 145 (+V+V1).

High side current source element circuit 134 shown in FIG. 5 and high side current source element circuit 154 shown FIG. 6 can be used to replace circuits typically implemented using a p-channel transistor in CMOS logic circuits. This allows creation of a new class of devices implemented in RDHEMT process technology that eliminates the need to increase fabrication cost and complexity by integrating enhancement mode (p-channel) devices which turn on with a negative voltage relative to the source.

Figure 7:
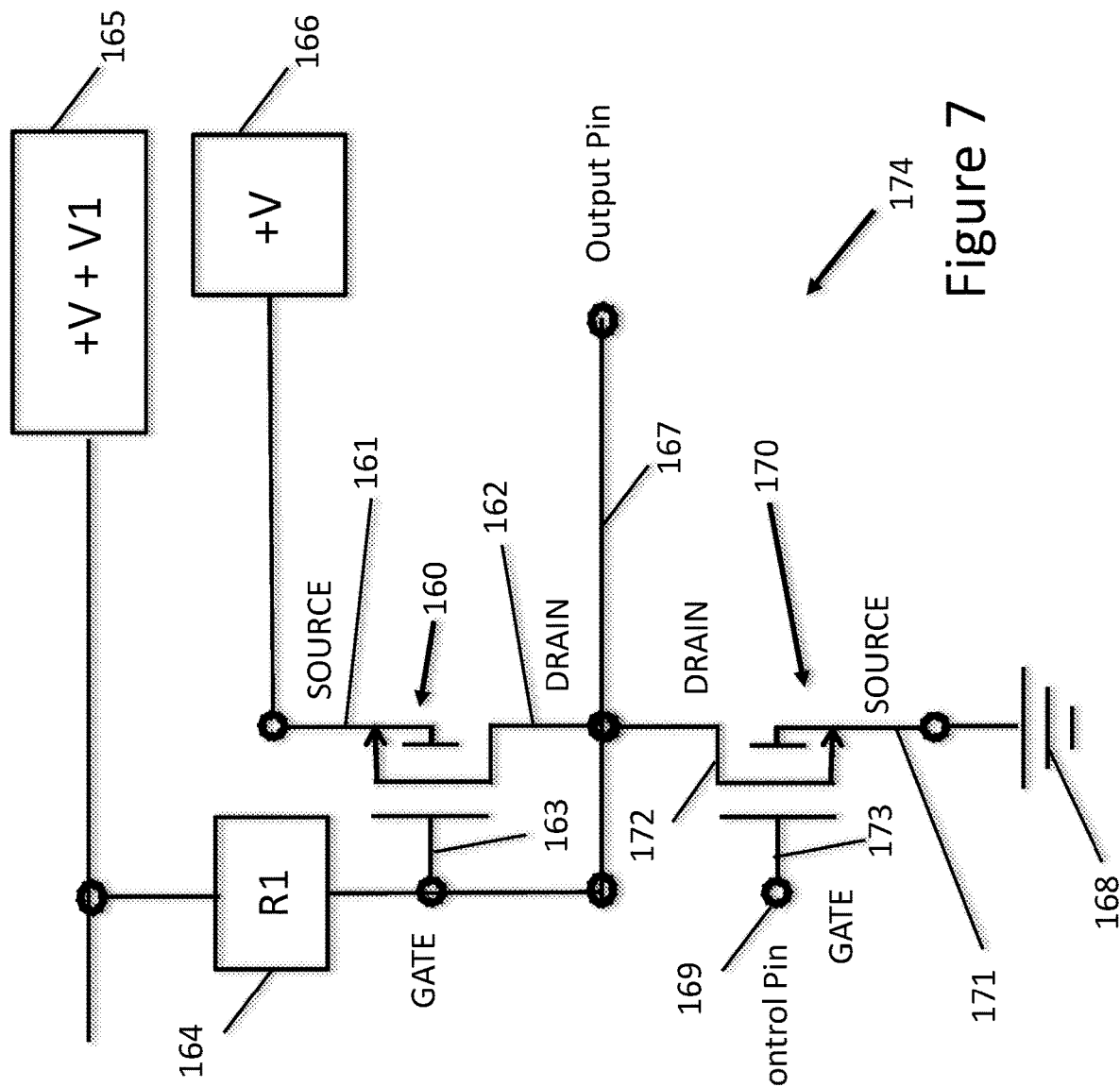
FIG. 7 is a simplified circuit diagram of an inverter circuit.

FIG. 7 shows an inverter circuit 174 that can be used to implement an inverter, an inverting buffer or a reverse direction high-electron (RDHE) inverter. A current limiting component 164 is, for example, a resistor or depletion mode transistor.

An RDHEMT 160 has a source 161, a drain 162 and a gate 163. A transistor 170 has a source 171, a drain 172 and a gate 173. Source 161 of RDHEMT 160 is connected to a reference voltage 166 (+V). Drain 162 of RDHEMT 160 is connected to an output pin 167, to drain 172 of RDHEMT 170 and to current limiting component 164.

Source 171 of transistor 170 is connected to a reference voltage 168 (GND). Drain 172 of transistor 170 is connected to output pin 167, to drain 162 of RDHEMT 160 and to current limiting component 164. Gate 173 of transistor 170 is connected to control pin input 169 controlled by the integrated circuit. Current limiting component 164 is connected between output pin 167 and reference voltage 165 (+V+V1).

For example, transistor 170 is a HEMT. When control pin 169 at gate 173 of gate transistor 170 is switched from LOW to HIGH sufficiently so that the voltage at gate 173 is above the threshold voltage of transistor 170, transistor 170 will turn ON. RDHEMT 160 will have been turned ON in low conduction mode, so output pin 167 will be pulled low to GND by transistor 170. This will pull gate 163 of RDHEMT 160 low to GND as the resistance of current limiting component 164 and RDHEMT 160 in low conduction mode is sufficiently higher than transistor 170 during this transition. The drain to source voltage (Vds) of RDHEMT 160 will be equal to −|+V|. With a −Vgs voltage of −|+V|, RDHEMT 160 is turned off.

When the voltage on control pin 169 at gate 173 of gate transistor 170 is switched from high to low (GND), transistor 170 is turned OFF. RDHEMT 160 has a negative Vds of −|+V| so it is in high conduction mode. When transistor 170 turns off, current limiting component 164 will pull gate 163 of RDHEMT 160 to +V+V1 and the increase in gate voltage at gate 163 will cause RDHEMT 160 to conduct in the reverse direction. The absolute value of the negative voltage on −Vds will decrease and the output will be pulled to +V and RDHEMT 160 will be in low conduction mode as illustrated by the voltage characteristics shown in FIG. 2.

At the start of the switching process when the voltage on output pin 167 shifts from output high to output low, RDHEMT 160 will be in a low conduction state with Vds=0, so the current shoot through RDHEMT 160 will be minimized when the voltage value on control pin 169 goes high and thus turns on HEMT transistor 170.

The foregoing discussion discloses and describes merely exemplary methods and embodiments. As will be understood by those familiar with the art, the disclosed subject matter may be embodied in other specific forms without departing from the spirit or characteristics thereof. Accordingly, the present disclosure is intended to be illustrative, but not limiting, of the scope of the invention, which is set forth in the following claims.

What is claimed is:

1. A high side current source element circuit comprising:
an output;
a first reference voltage;
a second reference voltage;
a third reference voltage;
a reverse direction high-electron-mobility transistor, the reverse direction high-electron-mobility transistor including:
a source connected to the second reference voltage,
a gate, and
a drain connected to the output;
a transistor, including:
a source connected to the third reference voltage,
a gate connected to a control pin, and
a drain connected to the gate of the reverse direction high-electron-mobility transistor; and a current limiting component connected between the first reference voltage and the gate of the reverse direction high-electron-mobility transistor.

2. A high side current source element as in claim 1, wherein the reverse direction high-electron-mobility transistor is a Gallium nitride high-electron-mobility transistor where an Aluminum Gallium Nitride (AlGaN) region is formed over a non-doped narrow-bandgap channel layer of Gallium Nitride (GaN).

3. A high side current source element as in claim 1, wherein the reverse direction high-electron-mobility transistor is an indium Phosphate (InP) based high-electron-mobility transistor.

4. A high side current source element as in claim 1, wherein the transistor is a high-electron-mobility transistor.

5. A high side current source element as in claim 1, wherein the current limiting component is a resistor.

6. A high side current source element as in claim 1, wherein the current limiting component is a depletion mode transistor.

7. A high side current source element as in claim 1, wherein the transistor is a metal-oxide-semiconductor field-effect transistor.

8. A high side current source element circuit comprising:
an output;
a first reference voltage;
a second reference voltage;
a reverse direction high-electron-mobility transistor, the reverse direction high-electron-mobility transistor including:
a source connected to the first reference voltage,
a gate, and
a drain connected to the output;
a transistor, including:
a source connected to the second reference voltage,
a gate connected to a control pin, and
a drain connected to the gate of the reverse direction high-electron-mobility transistor; and
a current limiting component connected between the first reference voltage and the gate of the reverse direction high-electron-mobility transistor.

9. A high side current source element as in claim 8, wherein the transistor is a metal-oxide-semiconductor field-effect transistor.

10. A high side current source element as in claim 8, wherein the transistor is a high-electron-mobility transistor.

11. A high side current source element as in claim 8, wherein the current limiting component is a resistor.

12. A high side current source element as in claim 8, wherein the current limiting component is a depletion mode transistor.

13. A high side current source element as in claim 8, wherein the reverse direction high-electron-mobility transistor is a Gallium nitride high-electron-mobility transistor where an Aluminum Gallium Nitride (AlGaN) region is formed over a non-doped narrow-bandgap channel layer of Gallium Nitride (GaN).

14. An inverter circuit comprising:
an output;
a first reference voltage;
a second reference voltage;
a third reference voltage;
a reverse direction high-electron-mobility transistor, the reverse direction high-electron-mobility transistor including:
a source connected to the second reference voltage,
a gate, and
a drain connected to the output and to the gate of the reverse direction high-electron-mobility transistor;
a transistor, including:
a source connected to the third reference voltage,
a gate connected to a control pin, and
a drain connected to the gate of the reverse direction high-electron-mobility transistor and to the drain of the reverse direction high-electron-mobility transistor; and
a current limiting component connected between the first reference voltage and the gate of the reverse direction high-electron-mobility transistor.

15. An inverter as in claim 14, wherein the transistor is a metal-oxide-semiconductor field-effect transistor.

16. An inverter as in claim 14, wherein the transistor is a high-electron-mobility transistor.

17. An inverter as in claim 14, wherein the current limiting component is a resistor.

18. An inverter as in claim 14, wherein the current limiting component is a depletion mode transistor.

19. An inverter as in claim 14, wherein the reverse direction high-electron-mobility transistor is a Gallium nitride high-electron-mobility transistor where an Aluminum Gallium Nitride (AlGaN) region is formed over a non-doped narrow-bandgap channel layer of Gallium Nitride (GaN).

20. An inverter as in claim 14, wherein the reverse direction high-electron-mobility transistor is an Indium Phosphate (InP) based high-electron-mobility transistor.

* * * * *